United States Patent
Wu

(10) Patent No.: US 10,923,006 B2
(45) Date of Patent: Feb. 16, 2021

(54) DRIVING VOLTAGE COMPENSATING METHOD AND CIRCUIT FOR DISPLAY DEVICE

(71) Applicant: Xianyang Caihong Optoelectronics Technology Co., Ltd, Xianyang (CN)

(72) Inventor: Yuan-Liang Wu, Xianyang (CN)

(73) Assignee: XIANYANG CAIHONG OPTOELECTRONICS TECHNOLOGY CO., LTD, Xianyang (CN)

( * ) Notice: Subject to any disclaimer, the term of this patent is extended or adjusted under 35 U.S.C. 154(b) by 84 days.

(21) Appl. No.: 16/158,561

(22) Filed: Oct. 12, 2018

(65) Prior Publication Data

US 2019/0114953 A1    Apr. 18, 2019

(30) Foreign Application Priority Data

Oct. 12, 2017  (CN) .......................... 2017 1 0948642

(51) Int. Cl.
*G09G 3/20* (2006.01)
*H01L 27/12* (2006.01)
*G09G 3/36* (2006.01)
*G09G 3/3225* (2016.01)

(52) U.S. Cl.
CPC ............. *G09G 3/20* (2013.01); *G09G 3/2092* (2013.01); *H01L 27/124* (2013.01); *G09G 3/3225* (2013.01); *G09G 3/3648* (2013.01); *G09G 2300/043* (2013.01); *G09G 2300/08* (2013.01); *G09G 2320/029* (2013.01); *G09G 2320/043* (2013.01); *G09G 2320/045* (2013.01)

(58) Field of Classification Search
CPC combination set(s) only.
See application file for complete search history.

(56) References Cited

U.S. PATENT DOCUMENTS

| | | | |
|---|---|---|---|
| 6,174,097 B1 * | 1/2001 | Daniel ................. | G06F 3/0221 400/472 |
| 10,223,972 B1 * | 3/2019 | Kuang ................. | G09G 3/3258 |
| 2008/0036706 A1 * | 2/2008 | Kitazawa ............. | G09G 3/3233 345/76 |
| 2012/0139842 A1 * | 6/2012 | Linegar ................ | G06F 1/1667 345/168 |
| 2015/0243218 A1 * | 8/2015 | Tseng ................... | G09G 3/3258 345/212 |
| 2016/0224157 A1 * | 8/2016 | Yang .................... | G06F 3/0412 |
| 2019/0035333 A1 * | 1/2019 | Chen .................... | G09G 3/3291 |

\* cited by examiner

*Primary Examiner* — Van N Chow
(74) *Attorney, Agent, or Firm* — WPAT, PC

(57) ABSTRACT

A driving voltage compensating method and a driving voltage compensating circuit for a display device are provided. The compensating method includes: providing a reference TFT; obtaining a driving current of the reference TFT; acquiring a compensation voltage value according to the driving current; and compensating a driving voltage for TFTs in a display area according to the compensation voltage value. By setting the reference TFT to obtain a drift behavior of I-V characteristic curve of the TFTs in the display area, obtaining the compensation voltage value according to a driving current drift value and compensating the driving voltage for the TFTs in the display area, the problem(s) of ghost and/or flicker in the display device caused by the drift of I-V characteristic curve resulting from a long-term voltage difference can be solved consequently.

10 Claims, 4 Drawing Sheets

DRIVING VOLTAGE COMPENSATING METHOD AND CIRCUIT FOR DISPLAY DEVICE

FIELD OF THE DISCLOSURE

The disclosure relates to the field of display technologies, and more particularly to a driving voltage compensating method and a driving voltage compensating circuit for a display device.

BACKGROUND

A thin film transistor liquid crystal display (TFT-LCD) device is one kind of active matrix type liquid crystal display (AM-LCD) devices. The liquid crystal display device especially the TFT-LCD device, is the sole display device that fully catches up and exceeds the CRT display device in terms of brightness, contrast, power consumption, life, volume and weight. It has properties of excellent performance, large-scale production characteristics, high automation for manufacturing, low cost of raw materials and broad development space, and has quickly become the mainstream product of the new century and a bright spot for global economic growth in the 21st century.

Referring to FIG. 1 and FIG. 2, FIG. 1 is a schematic view showing a working principle of a TFT in a display area in related art, and FIG. 2 is a schematic view showing changes of I-V characteristic curves of a selected TFT in the display area in related art. For the non-ideal structure of the TFT in the display area, since the TFT is in such a manner that a gate thereof is at a low voltage while a source and a drain thereof are at a high voltage for a long time, causing a long-term voltage difference between the gate and the source/drain, and under the long-term voltage difference, the I-V characteristic of the TFT changes/drifts and thereby causing a drain current Id to drift, resulting in that the drain current Id would change under a same gate voltage and thereby causing the change of leakage rate of pixels in the display area, which is extremely easy to produce a problem(s) of ghost and/or flicker.

Therefore, how to avoid the problem(s) of ghost and/or flicker caused by the drift of I-V characteristic of the TFT in the display area is one of the difficult problems that the display technology needs to solve.

SUMMARY

In order to solve the above problem(s) in prior art, the disclosure provides a driving voltage compensating method and a driving voltage compensating circuit for a display device.

In an embodiment, a driving voltage compensating method for a display device is provided. The compensating method includes steps of: providing a reference TFT; obtaining a driving current of the reference TFT; acquiring a compensation voltage value according to the driving current; and compensating a driving voltage for TFTs in a display area according to the compensation voltage value.

In an embodiment, the compensating method further includes: in a display mode, applying voltages on a source, a drain and a gate of the reference TFT to simulate voltages of sources, drains and gates of the TFTs in the display area.

In an embodiment, the reference TFT is disposed in a dummy region outside the display area.

In an embodiment, the step of acquiring a compensation voltage value according to the driving current includes: obtaining a driving current drift value according to the driving current, and searching a compensation lookup table according to the driving current drift value to acquire the compensation voltage value.

In an embodiment, the step of compensating a driving voltage for TFTs in the display area according to the compensation voltage value includes: adding the compensation voltage value on a gate-on voltage or a gate-off voltage for all the TFTs in the display area; or subtracting the compensation voltage value from the gate-on voltage or the gate-off voltage for all the TFTs in the display area.

In an embodiment, the step of compensating a driving voltage for TFTs in the display area according to the compensation voltage value includes: simultaneously adding the compensation voltage value on a gate-on voltage and a gate-off voltage for all the TFTs in the display area; or simultaneously subtracting the compensation voltage value from the gate-on voltage and the gate-off voltage for all the TFTs in the display area In an embodiment, a driving voltage compensating circuit for a display device is provided. The compensating circuit includes: a driving current detector configured (i.e., structured and arranged) to obtain a driving current of a reference TFT; a compensation voltage obtainer configured to obtain a compensation voltage value according to the driving current; and a compensator configured to compensate a driving voltage for TFTs in a display area according to the compensation voltage value.

In an embodiment, the compensating circuit includes working modes including a display mode and a detection compensation mode.

In an embodiment, a start of the detection compensation mode is set in a period of the display device being powered on, or a display image of the display device being switched, or a signal source of the display device being switched.

In an embodiment, the driving current detector includes a reference TFT; and in the display mode, a source, a drain and a gate of the reference TFT are applied with voltages to respectively simulate voltages of sources, drains and gates of the TFTs in the display area.

In an embodiment, in the detection compensation mode, the driving current detector obtains the driving current of the reference TFT, and the compensation voltage obtainer obtains a driving current drift value of the reference TFT according to the driving current of the reference TFT.

In an embodiment, in the detection compensation mode, the compensation voltage obtainer searches a compensation lookup table according to the driving current drift value of the reference TFT to obtain the compensation voltage value, and the compensator compensates the driving voltage for the TFTs in the display area according to the compensation voltage value.

In summary, the embodiments of the disclosure acquire a drift situation of driving current of the TFTs in the display area by providing a reference TFT, and then obtain the compensation voltage value according to the drift situation of driving current to compensate the driving voltage for the TFTs in the display area, which can solve the problem(s) of ghost and/or flicker in the display device caused by I-V curve drift resulting from a long-term voltage difference.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the drawings.

DETAILED DESCRIPTION OF PREFERRED EMBODIMENTS

Figure 1:
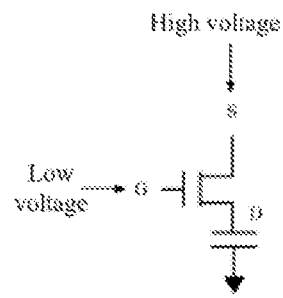
FIG. 1 is a schematic principle view of a TFT of a display device worked under a long-term bias voltage in related art.
Figure 2:
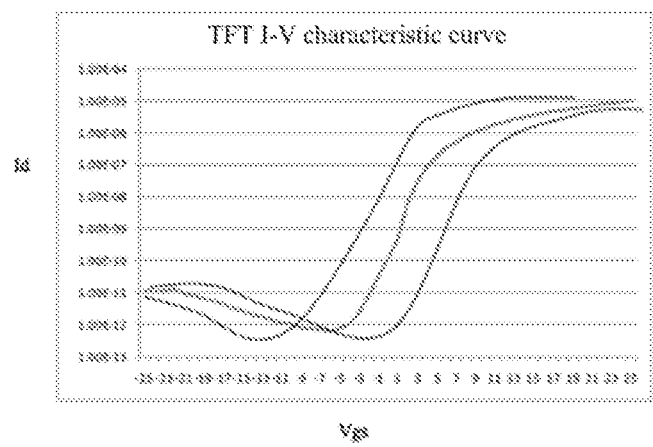
FIG. 2 is a schematic view showing changes of I-V characteristic curves of a selected TFT of the display device under a long-term bias voltage in related art.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Embodiment 1

Figure 3:
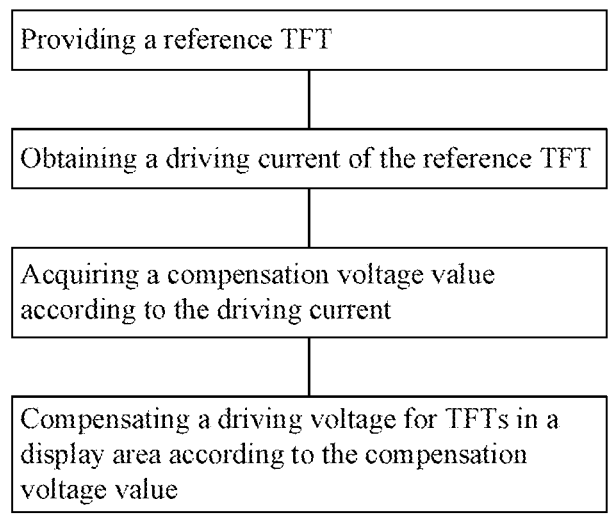
FIG. 3 is a schematic flowchart of a driving voltage compensating method for a display device according to an embodiment of the disclosure.
Figure 4:
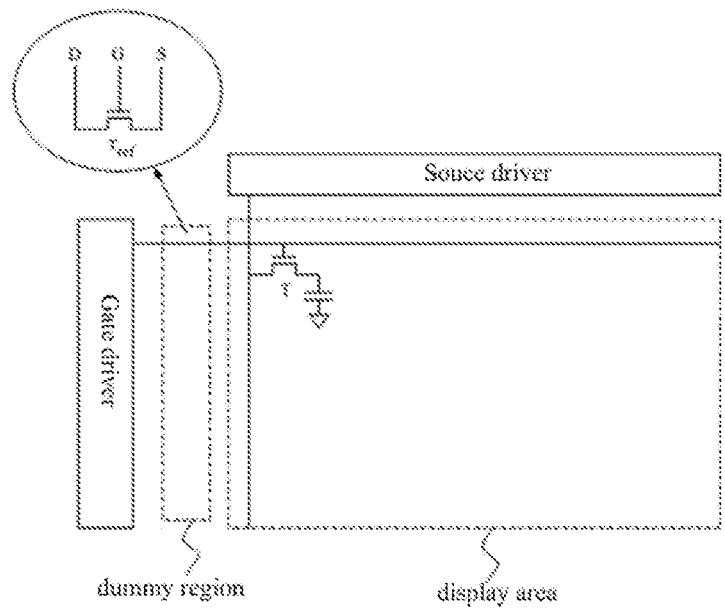
FIG. 4 is a schematic view showing a position of a reference TFT according to an embodiment of the disclosure.

Please refer to FIG. 3 and FIG. 4, FIG. 3 is a schematic flowchart of a driving voltage compensation method for a display device according to an embodiment of the disclosure, and FIG. 4 is a schematic view showing a position of a reference TFT according to an embodiment of the disclosure. The driving voltage compensation method is adapted for various display devices employing TFTs, such as an OLED display device, a LCD display device, and a working principle thereof also is suitable for other types of display devices and thus it is not limited herein.

Specifically, the compensating method includes following steps of: providing a reference TFT; obtaining a driving current of the reference TFT; acquiring a compensation voltage value according to the driving current; and compensating a driving voltage for a TFT(s) in a display area according to the compensation voltage value.

In a display mode, voltages applied on a source, a drain and a gate of the reference TFT respectively are same as voltages of a source, a drain and a gate of each the TFT in the display area; or have differences relative to the voltages of the source, the drain and the gate of each the TFT in the display area respectively less than 10%; as long as a working state of each the TFT in the display area is simulated.

In addition, the reference TFT may be disposed at any position of the liquid crystal panel rather than the display area, for example the dummy region, as long as a normal image display is not affected and the test can be completed, and thus it is not limited herein.

Moreover, a manner of acquiring a compensation voltage value according to the driving current preferably is that: searching a compensation lookup table according to the driving current to acquire the compensation voltage value.

It is noted that, a manner of compensating a driving voltage for TFTs in a display area according to the compensation voltage value may be one of following manners.

A first manner is that: adding the compensation voltage value on a gate-on voltage for the TFTs in the display area, or subtracting the compensation voltage value from the gate-on voltage for the TFTs in the display area;

A second manner is that: adding the compensation voltage value on a gate-off voltage for the TFTs in the display area, or subtracting the compensation voltage value from the gate-off voltage for the TFTs in the display area;

A third manner is that: simultaneously, adding the compensation voltage value on or subtracting the compensation voltage value from a gate-on voltage and a gate-off voltage for the TFTs in the display area. The third manner can well ensure the symmetry of voltage positive and negative polarities.

In addition, regarding the compensation for the TFTs in the display area, it may compensate some of the TFTs in the display area, or all of the TFTs in the display area, and thus it can flexibly set according to actual requirement. For example, when the user uses the display device to display one picture or a limited number of pictures, it may be that TFTs in some area are in a high load state for a long time and thus are damage more serious than TFTs in other area, and at this situation it can only compensate TFTs connected with some of scan lines of the display device according to actual requirement.

Sum up, in the embodiment of the disclosure, a certain position rather than the display area is disposed with the reference TFT, and the reference TFT then is detected to obtain the driving current of the TFTs in the display area; afterwards the compensation voltage value is acquired based on the driving current to compensate the driving voltage for the TFTs in the display area, which can solve the problem(s) of ghost and/or flicker caused by the drift of I-V curve of TFT resulting from the long-term voltage difference as mentioned in related art.

Embodiment 2

Figure 5:
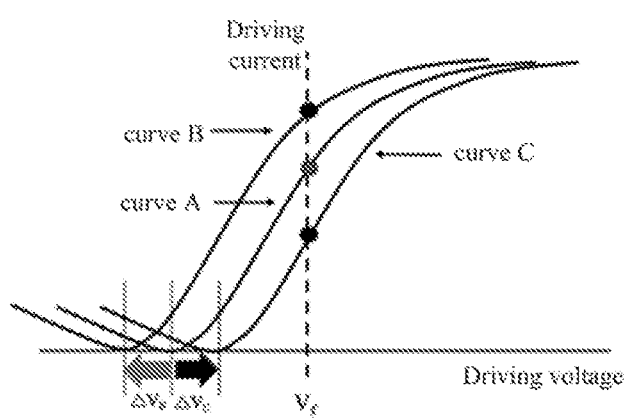
FIG. 5 is a schematic principle view of establishing a compensation lookup table according to an embodiment of the disclosure.
Figure 6:
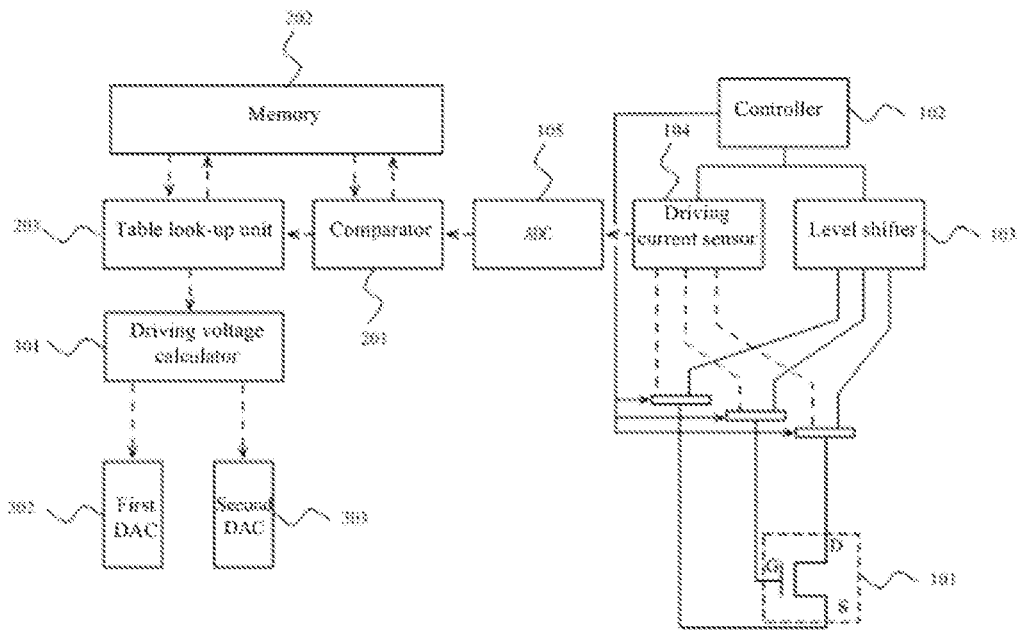
FIG. 6 is a schematic principle view of a driving voltage compensating circuit in a display mode according to an embodiment of the disclosure.
Figure 7:
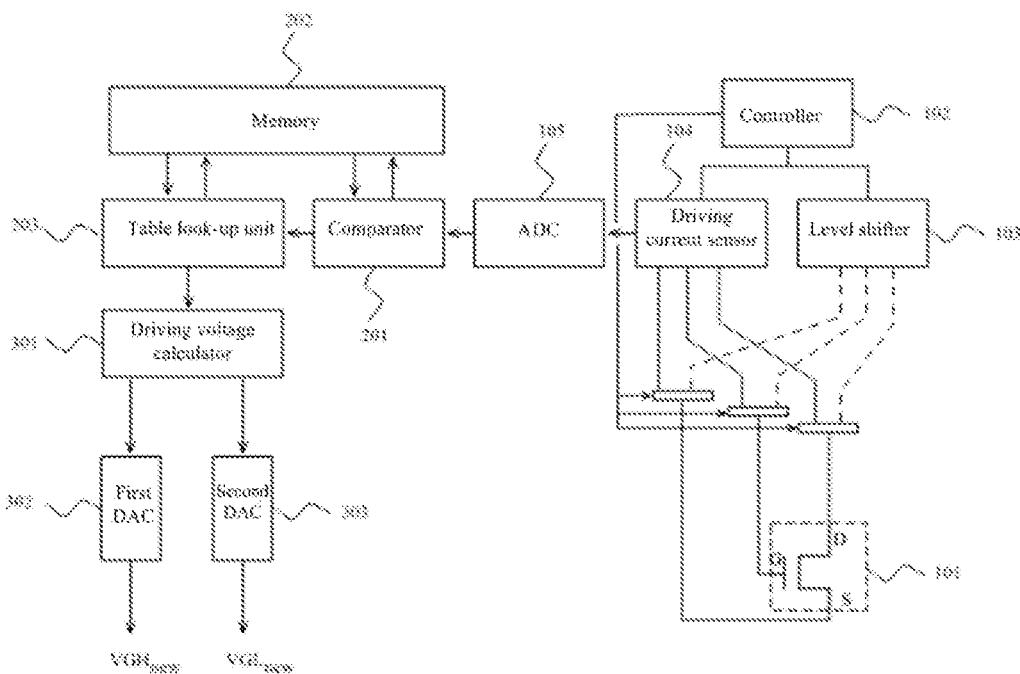
FIG. 7 is a schematic principle view of the driving voltage compensating circuit in a detection compensation mode according to an embodiment of the disclosure.
Figure 8:
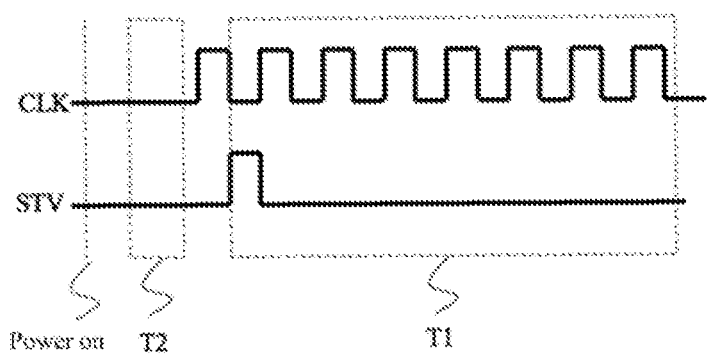
FIG. 8 is a schematic timing diagram of the driving voltage compensating circuit according to an embodiment of the disclosure.

Referring to FIG. 4 through FIG. 8, FIG. 4 is a schematic view showing a position of a reference TFT according to an embodiment of the disclosure, FIG. 5 is a schematic principle view of establishing a compensation lookup table according to an embodiment of the disclosure, FIG. 6 is a schematic principle view of a driving voltage compensating circuit in a display mode according to an embodiment of the disclosure, FIG. 7 is a schematic principle view of the driving voltage compensating circuit in a detection compensation mode according to an embodiment of the disclosure, and FIG. 8 is a schematic timing diagram of the driving voltage compensating circuit according to an embodiment of the disclosure. On the basis of the above embodiment, this embodiment takes that the reference TFT is disposed in the dummy region and all TFTs in the display area are compensated as an example, a driving voltage compensating method associated with this embodiment will be described below in detail.

In particular, the compensating method includes the following steps.

S21: a reference TFT with device parameters approximately the same or exactly the same as that of the TFTs in the display area of the display device is disposed in the dummy region.

Please refer to FIG. 4 again, the reference TFT i.e., $T_{ref}$ may be located at a position in the dummy region illustrated in the drawing, and this illustrated position only is exemplary. The position of the reference TFT may be flexibly set according to actual requirement and thus not limited to the illustration in the drawing.

It is noted that, regarding the device parameters of the reference TFT, if one of the device parameters has less influence on the driving voltage and the driving current, it may be not exactly the same as the device parameter of the TFTs in the display area. For example, the device parameter may be a size of the TFT, and thus a TFT with a smaller size can be used as the reference TFT, and it also can be searched and compensated by the compensation lookup table. Of course, it should be understood that, it is preferred that the reference TFT and the TFTs in the display area have exactly same device parameters.

In addition, referring to FIG. 5 again, in order to realize the compensating method of the disclosure, a compensation lookup table is expected to be established by testing the reference TFT. In particular, assuming that a source voltage and a drain voltage of the reference TFT respectively are $V_s$ and $V_d$. As illustrated in FIG. 5, the curve A indicates an original I-V characteristic curve without drift. I-V characteristic curves corresponding to conditions of the gate being at a low voltage while the source being at a high voltage for a long time can be obtained by testing. Curve B and curve C respectively represent I-V characteristic curves corresponding to different bias voltages. According to these I-V characteristic curves, different driving current values at the driving voltage being $V_f$ corresponding to fixed source voltages and drain voltages can be acquired. For example, if the driving current is I when the driving voltage is $V_f$ on curve A, the I is a target driving current in the detection compensation mode, the driving currents on the curve B and the curve B corresponding to the driving voltage $V_f$ respectively are $I_{dB}$ and $I_{dC}$. The driving current drift values are that $\Delta I_{dB}=|I_{dB}-I_{dA}|$, $\Delta I_{dC}=|I_{dC}-I_{dA}|$. At the same time, the driving voltage compensation values corresponding to $\Delta I_{dB}$ and $\Delta I_{dC}$ can be obtained as $\Delta V_B$ and $\Delta V_C$ respectively. The correspondence between the driving current drift values $\Delta I_{dB}$ and $\Delta I_{dC}$ and the corresponding driving voltage compensation values $\Delta V_B$ and $\Delta V_C$ is recorded in the compensation lookup table. Similarly, the correspondence between the driving voltage compensation value $\Delta V$ and the driving current drift value $\Delta I_d$ at different bias voltage conditions can be obtained and recorded in the compensation lookup table. The compensation lookup table and the target driving current $I_{dA}$ are stored in a memory of the display device.

Preferably, the driving voltage $V_f$ is the point at which a slope of the original I-V characteristic curve is the maximum. Of course, in an actual application, a suitable driving voltage $V_f$ can be selected on a curve segment having a slope larger than a certain threshold.

Referring to FIG. 6 again, in the display mode, that is, in a normal working period of the to-be-compensated TFTs in the display area, voltages (or potentials) on the source S, the drain D and the gate G of the reference TFT respectively keep the same as that of the source, the drain and the gate of each of the TFTs in the display area at all times, or less than that of the source, the drain and the gate of each the TFT in the display area with 10% at all times. As such, change trends of I-V characteristic curves of the reference TFT and the TFTs in the display area are approximately the same, that is, drifts of the reference TFT and the TFTs are approximately the same.

In an exemplary embodiment, in the display mode, the voltages applied on the source S, the drain D and the gate G of the reference TFT respectively are set to be an average value of source voltages, an average value of drain voltages and an average value of gate voltages of all the TFTs in the display area; or the voltages applied on the source S, the drain D and the gate G of the reference TFT respectively are set to be that of the source, the drain and the gate of a TFT with a maximum or a minimum gate-source voltage difference in all TFTs in the display area.

S22: a driving current of the reference TFT is obtained in the detection compensation mode.

Please refer to FIG. 7 again, in the detection compensation mode, voltages applied on the source S and the drain D of the reference TFT 101 are being equal to the source voltage $V_s$ and the drain voltage $V_d$ used during establishing the compensation lookup table, the voltage applied on the reference TFT 101 is set to be $V_f$, and then a corresponding current $I_{dref}$ can be obtained.

S23: the compensation voltage value $\Delta V$ is obtained according to the driving current $I_{dref}$.

In particular, the driving current $I_{dref}$ is compared with the target driving current $I_{dA}$ corresponding to the driving voltage $V_f$ on the original I-V characteristic curve to obtain $\Delta I$, and then the compensation voltage value $\Delta V$ is obtained by searching the compensation lookup table according to $\Delta I$, and meanwhile the compensation direction also is obtained, that is, if $I_{dref} > I_{dA}$, $\Delta V$ is positive, or else, $\Delta V$ is negative.

S24: the driving voltage for the TFTs in the display area is compensated based on the compensation voltage value $\Delta V$, thereby the gate-off voltage for the TFTs in the display area can keep a lowest current.

Assuming that a gate-on voltage and a gate-off voltage for the TFTs in the display area respectively are VGH and VGL, after the compensation voltage value $\Delta V$ is obtained, a gate-on voltage $VGH_{new}$ and a gate-off voltage $VGL_{new}$ for the TFTs in the display area are obtained as per the following expressions that:

$$VGH_{new} = VGH \pm \Delta V$$

$$VGL_{new} = VGL \pm \Delta V$$

Where VGH and VGL are the gate-on voltage and the gate-off voltage before compensation, $+\Delta V$ represents the compensation direction is a positive direction, and $-\Delta V$ represents the compensation direction is a negative direction.

In an exemplary embodiment, during establishing the compensation lookup table, when $\Delta I$ and $\Delta V$ are calculated, the absolute values thereof may be not calculated, and positive and negative symbols of the compensation voltage value are directly stored in the compensation lookup table. As such, the expressions for calculating the new gate-on voltage $VGH_{new}$ and gate-off voltage $VGL_{new}$ may be adjusted to be that:

$$VGH_{new} = VGH + \Delta V$$

$$VGL_{new} = VGL + \Delta V.$$

It is indicated that, VGH and VGL may not be simultaneously corrected/compensated; for example, only VGH is corrected to be $VGH_{new}$, or VGL is corrected to be $VGL_{new}$. Preferably, VGH and VGL are simultaneously corrected with a same compensation value, which can avoid changing the symmetry of voltage positive and negative polarities for the TFTs in the display area.

Herein, the calculated gate-on voltage $VGH_{new}$ and gate-off voltage $VGL_{new}$ both are digital signals, the gate-on voltage $VGH_{new}$ and gate-off voltage $VGL_{new}$ then are converted into analog voltages by digital-to-analog converters (DACs) and inputted to a power module (e.g., a power management IC) as a turn-on voltage and a turn-off voltage for the TFTs in the display area at a normal working period. At this time, the gate-off voltage of the TFTs in the display area can keep a lowest current.

The detection compensation mode can be set in a period of the display device being powered on, or a display image of the display device being switched, or a signal source of the display device being switched.

Referring to FIG. 8 again, T1 is a working period of the display mode, and the working period T2 of the detection compensation mode is set to be started immediately after the display device is powered on with respect to the display mode.

Preferably, the working period T2 of the detection compensation mode is in a range from 7 μs to 1 ms.

It is noted that, the driving voltage in this embodiment is the voltage of gate-source of the TFTs in the display area, it may be the voltage of the gate-drain of the TFTs instead, this is because the source and the drain of the TFT are interchangeable, the principles are the same and thus will not be repeated herein.

In summary, the driving voltage compensating method in the embodiment provides the reference TFT to simulate the TFTs in the display area, obtains the driving voltage compensation value for the TFTs in the display area by sensing the driving current of the reference TFT, and makes the TFTs in the display area use the compensated driving voltage in a normal working period, which facilitate the gate-off voltage for the TFTs in the display area to keep a lowest current and thereby avoid the problem(s) of ghost and/or flickers caused by leakage of pixel capacitor resulting from the drift of I-V characteristic curve.

Embodiment 3

Figure 9:
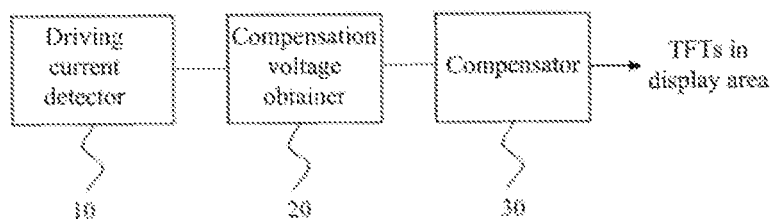
FIG. 9 is a schematic block diagram of the driving voltage compensating circuit according to an embodiment of the disclosure.

This embodiment of the disclosure introduces a driving voltage compensating circuit on the basis of the above-mentioned method. Referring to FIG. 9, FIG. 6 and FIG. 7, and FIG. 9 is a schematic block diagram of the driving voltage compensating circuit according to an embodiment of the disclosure. Specifically, the compensating circuit includes: a driving current detector 10, a compensation voltage obtainer 20 and a compensator 30.

The driving current detector 10 is configured (i.e., structured and arranged) to a driving current of a reference TFT 101. In particular, the driving current detector 10 includes the reference TFT 101, a controller 102, a level shifter 103, a driving current sensor 104 and an ADC 105. The controller 102 is individually connected to the driving current sensor 104 and the level shifter 103. The reference TFT 101 is connected to the driving current sensor 104 and the level shifter 103 by a multiplexer (not shown). The driving current sensor 104 is connected with the ADC 105.

The reference TFT 101 is disposed in a region outside the display area, or termed as dummy region. Generally, the display area includes effective pixels containing the TFTs in the display area for performing an image display.

The compensation voltage obtainer 20 is configured to acquire a compensation voltage value according to the driving current. In particular, the compensation voltage obtainer 20 includes a comparator 201, a memory 202 and a table look-up unit 203. The comparator 201 and the table look-up unit 203 are connected together. The memory 202 is connected to the comparator 201 and the table look-up unit 203. In an exemplary embodiment, the comparator 201 and table look-up unit 203 are embodied/implemented in a same processing circuit such as a processor.

The memory 202 is stored with the compensation lookup table and the target driving current $I_{dA}$ corresponding to the original I-V characteristic curve. The memory 202 may be a ROM or a non-volatile memory (NVM).

The compensator 30 is configured to compensate a driving voltage for the TFTs in the display area according to the compensation voltage value. In particular, the compensator 30 includes a driving voltage calculator 301, a first DAC 302 and a second DAC 303. The driving voltage calculator 301 is connected with the table look-up unit 203. In an exemplary embodiment, the driving voltage calculator 301 of the compensator 30 and the comparator 201 and table look-up unit 203 of the compensation voltage obtainer 20 are implemented in a same processing circuit such as a processor.

Moreover, working modes of the driving voltage compensating circuit for a display device according to this embodiment of the disclosure include a display mode and a detection compensation mode.

A working principle of the compensation circuit according to this embodiment of the disclosure will be described in detail as follows.

In the display mode, the controller 102 controls the level shifter 103 to output voltages on the source S, the drain D and the gate G of the reference TFT and makes driving manners of the reference TFT 101 and the TFTs in the display area be approximately the same, that is, the voltages on the source S, the drain D and the gate G of the reference TFT 101 respectively are approximately the same as voltages of a source, a drain and a gate of each of the TFTs in the display area. As such, drift behaviors of I-V characteristic curves of the reference TFT 101 and the TFTs in the display area have a certain regular similarity.

In an alternative embodiment, the voltages on the source S, the drain D and the gate G of the reference TFT 101 respectively may be set to be an average value of source voltages, an average value of drain voltages and an average value of gate voltages of all TFTs in the display area; or the voltages on the source S, the drain D and the gate G of the reference TFT 101 respectively may be set to be voltages of a source, a drain and a gate of a TFT with a maximum or minimum gate-source voltage difference in the TFTs in the display area.

In the display mode, the controller 102 controls the driving current sensor 104 to be at a non-working state. At this time, the driving current sensor 104 is without output, and thus the ADC 105, the compensation voltage obtainer 20 and the compensator 30 all are at non-working states correspondingly.

In the detection compensation mode, the controller 102 controls the level shifter 103 to output the voltages on the source S and drain D of the reference TFT 101 being equal to the source voltage $V_s$ and the drain voltage $V_d$ used during establishing the compensation lookup table, and to output the voltage on the gate of the reference TFT 101 as $V_f$, and meanwhile the controller 102 controls the driving current sensor 104 to start working. At this time, the driving current sensor 101 senses the driving current $I_{dref}$ of the reference TFT 101, the ADC 105, the compensation voltage obtainer 20 and the compensator 30 all are in working states. The ADC 105 converts the analog driving current $I_{dref}$ into a digital signal, the comparator 201 acquires the digital signal and compares the digital signal with the target driving current $I_{dA}$ stored in the memory 202 to obtain a driving current drift value $\Delta I$, and the table look-up unit 203 searches the compensation lookup table stored in the memory 202 according to the driving current drift value $\Delta I$ to obtain the compensation voltage value $\Delta V$.

The driving voltage calculator 301 calculates the gate-on voltage $VGH_{new}$ and the gate-off voltage $VGL_{new}$ after compensation according to the compensation voltage value $\Delta V$ as per the following expressions that:

$$VGH_{new} = VGH \pm \Delta V$$

$$VGL_{new} = VGL \pm \Delta V.$$

The gate-on voltage $VGH_{new}$ and the gate-off voltage $VGL_{new}$ respectively are converted by the first DAC 302 and the second DAC 303 into analog voltages and inputted to a power module (e.g., a power management IC) and further used as a turn-on voltage and a turn-off voltage for the TFTs in the display area in the display mode of next being powered on. At this situation, the gate-off voltage for the TFTs in the display area can keep a lowest current.

In an alternative embodiment, it may be that the compensating circuit enters the detection compensation mode after each being powered on and performs driving voltage compensation to the TFTs in the display area in the display mode of next being powered on, so that the gate-off voltage for the TFTs in the display area can keep a lowest current.

The compensating circuit of the embodiment of the disclosure provides a reference TFT to acquire the I-V characteristic curve drift situation of the TFTs in the display area, and obtains the compensation voltage value according to the driving current drift value to compensate the driving voltage for the TFTs in the display area, which can solve the problem(s) of ghost and/or flickers caused by the drift of I-V characteristic curve of TFT resulting from a long-term voltage difference as described in related art.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A driving voltage compensating circuit for a display device, comprising:
   a driving current detector, configured to obtain a driving current of a reference TFT;
   a compensation voltage obtainer, configured to obtain a compensation voltage value according to the driving current; and
   a compensator, configured to compensate a driving voltage for at least one TFT in a display area according to the compensation voltage value;
   wherein the compensating circuit comprises working modes including a display mode and a detection compensation mode;
   wherein the driving current detector comprises the reference TFT, a controller, a level shifter, a driving current sensor and an analog-to-digital converter (DAC); the controller is connected to the driving current sensor and the level shifter, the reference TFT is connected to the driving current sensor and the level shifter by a multiplexer, the ADC is connected to the driving current sensor; in the display mode, the controller controls the level shifter to output voltages on a source, a drain and a gate of the reference TFT to simulate voltages of a source, a drain and a gate of the TFT in the display area and controls the driving current sensor to be in a non-working state; and in the detection compensation mode, the controller controls the level shifter to output voltages on the source and the drain of the reference TFT respectively being equal to a source voltage and a drain voltage used during establishing a compensation lookup table and further to output a voltage on the gate of the reference TFT, and further controls the driving current sensor to start working, the driving current sensor senses the driving current of the reference TFT, and the ADC converts the driving current of the reference TFT into a digital signal.

2. The compensating circuit according to claim 1, wherein the detection compensation mode is set to be started in a period of the display device being powered on, or a display image being switched, or a signal source being switched.

3. The compensating circuit according to claim 2, wherein the driving current detector includes the reference TFT; and in the display mode, voltages are applied on a source, a drain and a gate of the reference TFT to respectively simulate voltages of a source, a drain and a gate of the TFT in the display mode.

4. The compensating circuit according to claim 3, wherein in the detection compensation mode, the driving current detector obtains the driving current of the reference TFT, and the compensation voltage obtainer acquires a driving current drift value of the reference TFT according to the driving current of the reference TFT.

5. The compensating circuit according to claim 4, wherein in the detection compensation mode, the compensation voltage obtainer searches a compensation lookup table according to the driving current drift value of the reference TFT to acquire the compensation voltage value, and the compensator compensates the driving voltage for the at least one TFT in the display area according to the compensation voltage value.

6. The compensating circuit according to claim 1, wherein the compensation voltage obtainer comprises a comparator, a memory and a table look-up unit; the comparator is connected to the ADC, the table look-up unit and the memory; the table look-up unit is connected to the memory; the memory is stored with the compensation lookup table and a target driving current corresponding to an original I-V characteristic curve; in the detection compensation mode, the comparator compares the digital signal with the target driving current stored in the memory to obtain a driving current drift value, the table look-up unit searches the compensation lookup table stored in the memory according to the driving current drift value to obtain the compensation voltage value.

7. The compensating circuit according to claim 6, wherein the compensator comprises a driving voltage calculator, a first digital-to-analog converter (DAC) and a second DAC; in the detection compensation mode, the driving voltage calculator calculates a compensated gate-on voltage and a compensated gate-off voltage according to the compensation voltage value, and the compensated gate-on voltage and the compensated gate-off voltage are converted into analog signals by the first DAC and the second DAC respectively.

8. A driving voltage compensating circuit for a display device, comprising:
a driving current detector, configured to obtain a driving current of a reference TFT;
a compensation voltage obtainer, configured to obtain a compensation voltage value according to the driving current; and
a compensator, configured to compensate a driving voltage for at least one TFT in a display area according to the compensation voltage value;
wherein the driving current detector comprises the reference TFT, a controller and a level shifter, the controller is configured to control the level shifter to output voltages on a source, a drain and a gate of the reference TFT;
wherein the compensating circuit comprises working modes including a display mode and a detection compensation mode,
wherein the driving current detector further comprises a driving current sensor and an analog-to-digital converter (DAC); the controller is connected to the driving current sensor and the level shifter, the reference TFT is connected to the driving current sensor and the level shifter by a multiplexer, the ADC is connected to the driving current sensor; in the display mode, the controller controls the level shifter to output voltages on the source, the drain and the gate of the reference TFT to simulate voltages of a source, a drain and a gate of the TFT in the display area and controls the driving current sensor to be in a non-working state; and in the detection compensation mode, the controller controls the level shifter to output voltages on the source and the drain of the reference TFT respectively being equal to a source voltage and the drain voltage used during establishing a compensation lookup table and further to output a voltage on the gate of the reference TFT, and further controls the driving current sensor to start working, the driving current sensor senses the driving current of the reference TFT, and the ADC converts the driving current of the reference TFT into a digital signal.

9. The compensating circuit according to claim 8, wherein the compensation voltage obtainer comprises a comparator, a memory and a table look-up unit; the comparator is connected to the ADC, the table look-up unit and the memory; the table look-up unit is connected to the memory; the memory is stored with the compensation lookup table and a target driving current corresponding to an original I-V characteristic curve; in the detection compensation mode, the comparator compares the digital signal with the target driving current stored in the memory to obtain a driving current drift value, the table look-up unit searches the compensation lookup table stored in the memory according to the driving current drift value to obtain the compensation voltage value.

10. The compensating circuit according to claim 9, wherein the compensator comprises a driving voltage calculator, a first digital-to-analog converter (DAC) and a second DAC; in the detection compensation mode, the driving voltage calculator calculates a compensated gate-on voltage and a compensated gate-off voltage according to the compensation voltage value, and the compensated gate-on voltage and the compensated gate-off voltage are converted into analog signals by the first DAC and the second DAC respectively.

* * * * *